US012026053B2

United States Patent
Law et al.

(10) Patent No.: US 12,026,053 B2
(45) Date of Patent: Jul. 2, 2024

(54) METHODS AND APPARATUS FOR REDUCING MICROBUMPS FOR INTER-DIE DOUBLE-DATA RATE (DDR) TRANSFER

(71) Applicant: Intel Corporation, Santa Clara, CA (US)

(72) Inventors: Hwa Chaw Law, Kuala Langat (MY); Kiun Kiet Jong, George Town (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 18/356,008

(22) Filed: Jul. 20, 2023

(65) Prior Publication Data

US 2023/0367674 A1    Nov. 16, 2023

Related U.S. Application Data

(63) Continuation of application No. 16/699,225, filed on Nov. 29, 2019, now abandoned.

(51) Int. Cl.
| | | |
|---|---|---|
| *G06F 11/10* | (2006.01) | |
| *H01L 23/00* | (2006.01) | |
| *H01L 23/538* | (2006.01) | |
| *H03M 13/00* | (2006.01) | |
| *H03M 13/29* | (2006.01) | |

(52) U.S. Cl.
CPC .......... *G06F 11/1068* (2013.01); *H01L 24/14* (2013.01); *H03M 13/2906* (2013.01); *H03M 13/616* (2013.01); *H01L 23/538* (2013.01)

(58) Field of Classification Search
CPC .... G06F 11/1068; H01L 24/14; H01L 23/538; H03M 13/2906; H03M 13/616
See application file for complete search history.

(56) References Cited

U.S. PATENT DOCUMENTS

| | | | |
|---|---|---|---|
| 7,447,948 B2 | 11/2008 | Galbi et al. | |
| 7,587,658 B1 | 9/2009 | Tong et al. | |
| 7,676,730 B2 | 3/2010 | Haugan et al. | |
| 7,870,459 B2 | 1/2011 | Hazelzet | |
| 8,402,404 B1 * | 3/2013 | Mehta | G06F 30/394 |
| | | | 716/139 |
| 8,589,769 B2 | 11/2013 | Dell et al. | |
| 9,263,157 B2 * | 2/2016 | Kilmer | G11C 29/70 |

(Continued)

OTHER PUBLICATIONS

M.Y. Hsiao, "A Class of Optimal Minimum Odd-weight-column SEC-DED Codes," IBM Journal of Research and Development (vol. 14, Issue: 4, Jul. 1970) Poughkeepsie, NY.

(Continued)

*Primary Examiner* — Guy J Lamarre
(74) *Attorney, Agent, or Firm* — Fletcher Yoder, P.C.

(57) ABSTRACT

An inter-die double data rate (DDR) data transfer scheme is provided. In particular, the data transfer scheme utilizes an error correction code (ECC) encoding scheme that exploits the DDR property that a single microbump defect can only yield four possible error scenarios. A specialized single error correcting, double error detecting, and double adjacent error correcting (SEC-DED-DAEC) encoding scheme that imposes at least four parity check matrix constraints may be used. Configured and operated in this way, a fewer number of parity check bits are required to detect data bit errors associated with a single defective microbump.

20 Claims, 13 Drawing Sheets

(56) References Cited

U.S. PATENT DOCUMENTS

| | | |
|---|---|---|
| 9,559,726 B2 | 1/2017 | Greenspan et al. |
| 9,785,570 B2 | 10/2017 | Hu et al. |
| 11,100,029 B2* | 8/2021 | Schulz .................... G06F 13/42 |
| 2002/0097613 A1* | 7/2002 | Raynham ............... G11C 29/72 |
| | | 714/E11.034 |
| 2012/0068339 A1 | 3/2012 | Miller et al. |
| 2016/0357630 A1 | 12/2016 | Kang et al. |
| 2017/0286197 A1 | 10/2017 | Halbert et al. |
| 2018/0293130 A1* | 10/2018 | Ware ................... G06F 11/1048 |
| 2018/0342265 A1* | 11/2018 | Dietrich .................. G11C 7/22 |
| 2019/0095264 A1 | 3/2019 | Tsern et al. |
| 2019/0295679 A1 | 9/2019 | Dono et al. |
| 2020/0243486 A1* | 7/2020 | Quader .................. H01L 25/50 |
| 2020/0264950 A1 | 8/2020 | Schaefer et al. |

OTHER PUBLICATIONS

Neale, Adam, "Design and Analysis of an Adjacent Multi-bit Error Correcting Code for Nanoscale SRAMs," UWSpace, Dec. 2, 2014, Retrieved from https://uwspace.uwaterloo.ca/handle/10012/8960 on Nov. 27, 2019.

* cited by examiner

FIG. 5

| d | n | k | r | 1+log2(n) |
|---|---|---|---|---|
| 8 | 8 | 4 | 4 | 4.0000 |
| 18 | 14 | 9 | 5 | 4.8074 |
| 20 | 15 | 10 | 5 | 4.9069 |
| 22 | 16 | 11 | 5 | 5.0000 |
| 32 | 22 | 16 | 6 | 5.4594 |
| 40 | 26 | 20 | 6 | 5.7004 |
| 48 | 30 | 24 | 6 | 5.9069 |
| 64 | 39 | 32 | 7 | 6.2854 |
| 72 | 43 | 36 | 7 | 6.4263 |
| 80 | 47 | 40 | 7 | 6.5546 |
| 96 | 55 | 48 | 7 | 6.7814 |
| 128 | 72 | 64 | 8 | 7.1699 |
| 144 | 80 | 72 | 8 | 7.3219 |
| 160 | 88 | 80 | 8 | 7.5494 |
| 176 | 96 | 88 | 8 | 7.5850 |
| 192 | 104 | 96 | 8 | 7.7004 |
| 208 | 112 | 104 | 8 | 7.8074 |
| 224 | 120 | 112 | 8 | 7.9069 |
| 256 | 137 | 128 | 9 | 8.0980 |
| 512 | 266 | 256 | 10 | 9.0553 |
| 1024 | 523 | 512 | 11 | 10.0307 |

FIG. 6

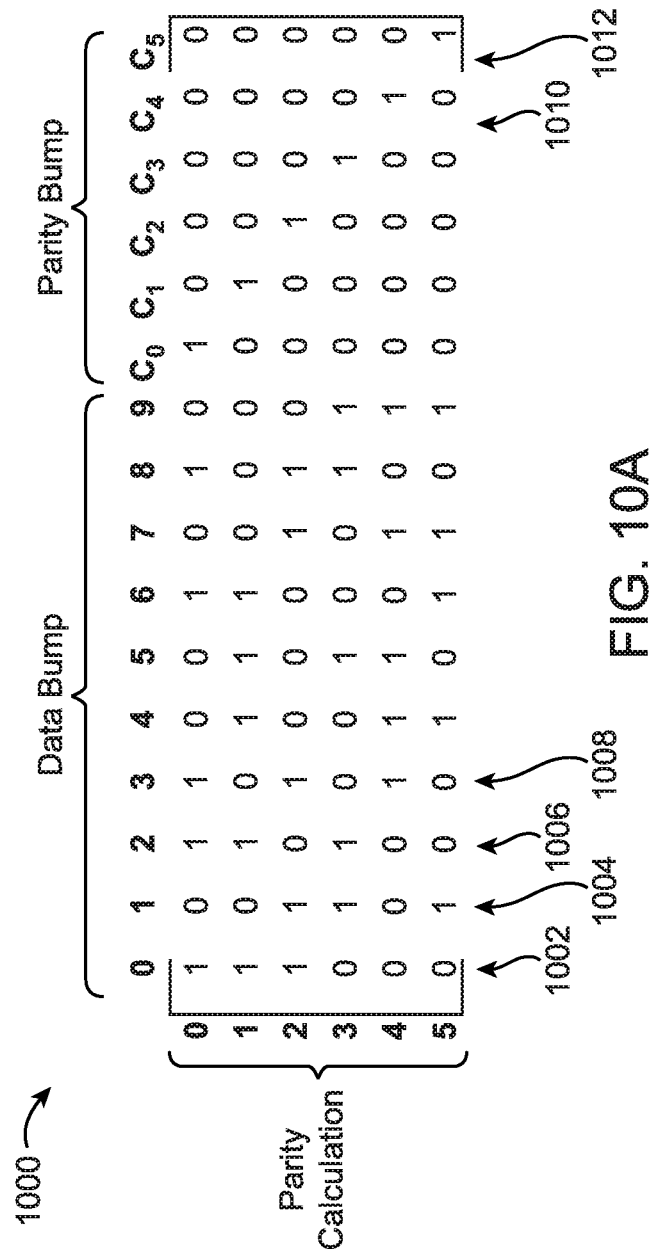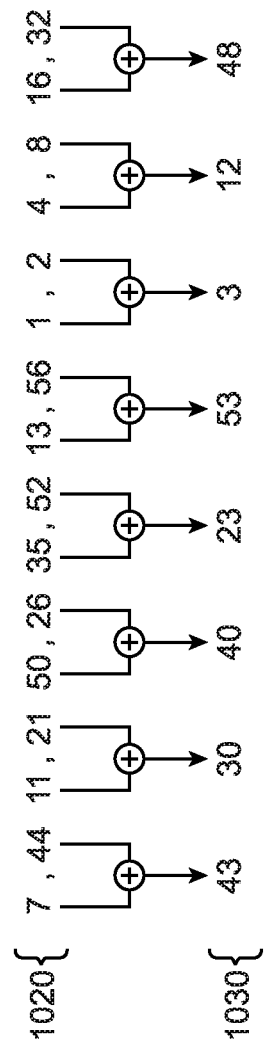
FIG. 10A
FIG. 10B

| d | n | k | s | (1+log$_2$(2k+2s))/2 |
|---|---|---|---|---|
| 8 | 7 | 4 | 3 | 2.4037 |
| 18 | 12 | 9 | 3 | 2.7925 |
| 20 | 13 | 10 | 3 | 2.8502 |
| 22 | 14 | 11 | 3 | 2.9037 |
| 32 | 20 | 16 | 4 | 3.1610 |
| 40 | 24 | 20 | 4 | 3.2925 |
| 48 | 28 | 24 | 4 | 3.4037 |
| 64 | 36 | 32 | 4 | 3.5850 |
| 72 | 40 | 36 | 4 | 3.6610 |
| 80 | 44 | 40 | 4 | 3.7297 |
| 96 | 52 | 48 | 4 | 3.8502 |
| 128 | 69 | 64 | 5 | 4.0543 |
| 144 | 77 | 72 | 5 | 4.1334 |
| 160 | 85 | 80 | 5 | 4.2047 |
| 176 | 93 | 88 | 5 | 4.2696 |
| 192 | 101 | 96 | 5 | 4.3291 |
| 208 | 109 | 104 | 5 | 4.2841 |
| 224 | 117 | 112 | 5 | 4.4352 |
| 256 | 133 | 128 | 5 | 4.5276 |
| 512 | 262 | 256 | 6 | 5.0167 |
| 1024 | 518 | 512 | 6 | 5.5084 |

FIG. 11

METHODS AND APPARATUS FOR REDUCING MICROBUMPS FOR INTER-DIE DOUBLE-DATA RATE (DDR) TRANSFER

CROSS-REFERENCE TO RELATED APPLICATIONS

This is a continuation of U.S. application Ser. No. 16/699,225, filed Nov. 29, 2019, entitled "METHODS AND APPARATUS FOR REDUCING MICROBUMPS FOR INTER-DIE DOUBLE-DATA RATE (DDR) TRANSFER," the disclosure of which is incorporated by reference in its entirety for all purposes.

BACKGROUND

This relates generally to integrated circuits and more particularly, to data transfer between two or more integrated circuit dies.

Consider a scenario in which a first integrated circuit die communicates with a second integrated circuit die via one or more potentially faulty interconnects. Conventionally, an interconnect redundancy scheme may be implemented to help repair potentially faulty interconnects to improve assembly yield. For example, a faulty interconnect may be repaired using an active redundancy scheme by selectively switching into use a spare driver block or by using a passive redundancy scheme using two or more duplicate paths for each critical signal. Such type of redundancy scheme that uses spare drivers or spare paths requires redundancy configuration before the data is transmitted. In other words, configuration data has to be first transferred from one die to another to configure/initial the desired redundancy scheme.

Data bits transmitted from one die to another are often susceptible to errors as a result of inadequate timing margins at corner cases, random bit flips, and/or other deterministic or nondeterministic sources of variation. To correct such errors, an error correcting code (ECC) scheme is sometimes implemented to detect or fix the erroneous data. An ECC scheme typically transmits the user data along with additional parity check bits. Using an ECC scheme can help obviate the need for redundancy configuration before the data transfer. The ECC scheme, however, requires additional input-output bumps for transferring the additional parity check bits. A traditional ECC scheme might require a large number of inter-die solder bumps, which is problematic for systems with a limited number of available solder bumps.

It is within this context that the embodiments described herein arise.

BRIEF DESCRIPTION OF THE DRAWINGS

FIG. 5 is a table showing how 26 microbumps are needed to transfer 40 data bits and 12 parity bits using the ECC encoding scheme shown in FIG. 4.

FIG. 6 is a table illustrating the total number of microbumps needed as a function of the number of data bits using the ECC encoding scheme shown in FIG. 4.

FIG. 10A is a diagram of an illustrative parity check matrix for an ECC(16,10) encoding scheme satisfying the four constraints shown in FIG. 9 in accordance with an embodiment.

FIG. 10B is a diagram illustrating additional parity bits that can be generated for double adjacent errors at the same microbump in accordance with an embodiment.

FIG. 11 is a table illustrating the total number of microbumps needed as a function of the number of data bits using the ECC encoding scheme shown in FIG. 9.

DETAILED DESCRIPTION OF SPECIFIC EMBODIMENTS

The present embodiments relate to a specialized error correcting code (ECC) scheme that takes advantage of the dual data rate (DDR) error characteristic at a single defective microbump interconnecting two dies within the same multichip package. Since even and odd data bits share the same microbump location, if a single microbump is faulty, it will either cause only the odd data bit to be erroneous, only the even data bit to be erroneous, both the odd and even data bits to be erroneous, or both the odd and even data bits to be error free. By recognizing and exploiting this unique DDR characteristic, the odd and even data bits can be evaluated together with one specialized ECC encoding scheme. Configured and operated in this way, fewer parity bits are required, which results in reducing the total requisite microbump overhead.

It will be recognized by one skilled in the art, that the present exemplary embodiments may be practiced without some or all of these specific details. In other instances, well-known operations have not been described in detail in order not to unnecessarily obscure the present embodiments.

Figure 1:
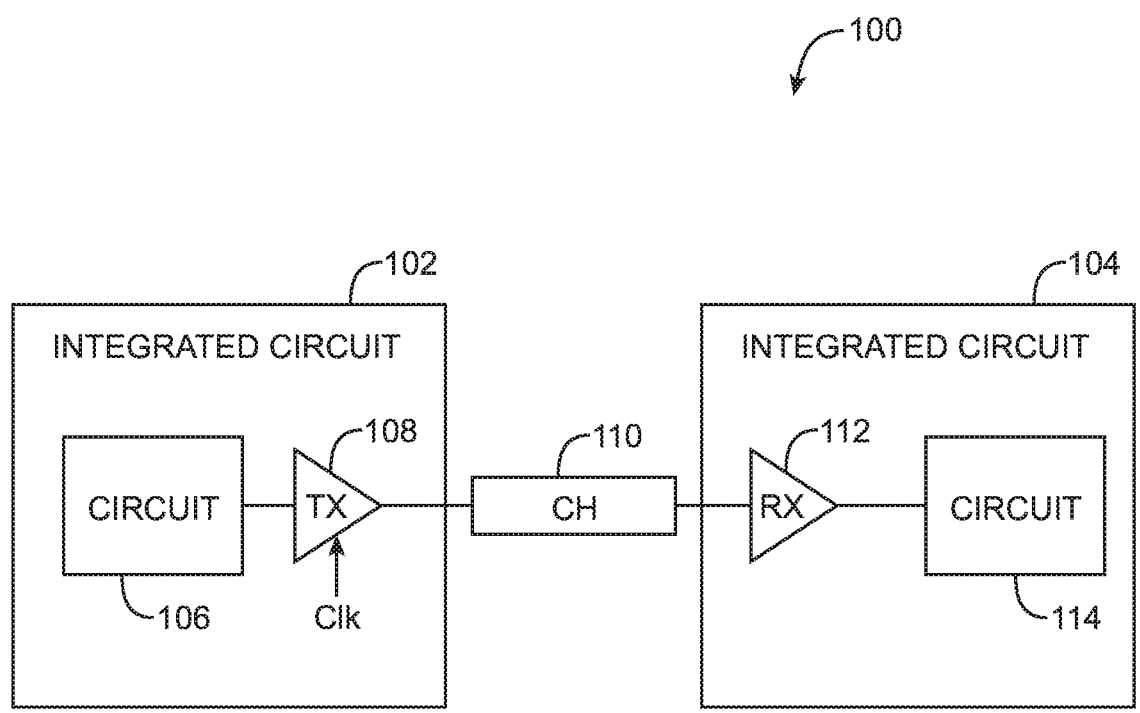
FIG. 1 is a diagram of an illustrative inter-die interconnection path in accordance with an embodiment.

FIG. 1 is a diagram of an illustrative system such as system 100. As shown in FIG. 1, system 100 may include components such as integrated circuits 102 and 104. Each of integrated circuits 102 and 104 may be, for example, an application specific integrated circuit (ASIC), a central processing units (CPU), a graphics processing units (GPU), a programmable integrated circuit such as a field-programmable gate array (FPGA) or other integrated circuit that contains programmable elements, a memory circuit, a digital signal processor, a microprocessor, a memory chip stack, a transceiver die, a network controller/adapter, a configuration circuit, or other suitable integrated circuit. Circuits 102 and 104 may be different types of integrated circuits. As an example, circuit 102 may be a programmable logic device, and circuit 104 may be a memory device. Devices 102 and 104 may contain circuitry such as core storage/processing circuits 106 and 114. Circuit 106 may produce data that is to be transmitted from integrated circuit 102 to integrated circuit 104 over interconnect path 110. Circuit 114 may consume, store, or other process the data that has been received at the receiving end of path 110.

Transmitter (TX) 108 may be configured to transmit data from circuit 106 to receiver (RX) 112 over interconnect 110 (sometimes referred to as a data channel). Transmitter 108 may, for example, be implemented as part of integrated circuit 102. Receiver 112 may, as an example, be implemented as part of integrated circuit 104. Data channel 110 may be formed from any suitable physical transmission medium. Examples of transmission paths that may be used in channel 110 include single conductive paths, differential signaling paths made up of pairs of conductive wires, coaxial cable paths and other transmission-line paths, paths on printed circuit boards, combinations of such paths, or other suitable communications paths. In a typical system 100, integrated circuits 102 and 104 may be mounted on one or more semiconductor substrates, and interconnect 110 may involve transmission line structures fabricated on the substrates.

In the example of FIG. 1, integrated circuit 102 contains a single transmitter 108, and integrated circuit 104 contains a single corresponding receiver 112. A single channel 110 is used to connect transmitter 108 to receiver 112. This is merely illustrative. If desired, integrated circuit 102 may contain multiple transmitters such as transmitter 108, and integrated circuit 104 may contain multiple corresponding receivers such as receiver 112. Multiple communications paths may be used to link the various transmitters and receivers. Integrated circuit 102 may also include one or more receivers that receive data from one or more corresponding transmitters on integrated circuit 104. Data may also be conveyed to and from additional integrated circuits using transmitters and receivers such transmitter 108 and receiver 112.

Transmitter 108 may be configured to transmit a data bit stream across interconnect 110 to receiver 112. Typical transfer speeds can across path 110 can be as high as 10 GBps (gigabytes per second) or more. Communications paths operating at such high data rates are sometimes referred to as high-speed intra-die input-output interconnects. Transmitter 108 may be controlled by a transmit clock signal such as signal Clk. Transmitter 108 may generate output data at a rate that is proportional to signal Clk. Embodiments herein generally relate to a double data rate (DDR) clocking scheme in which the output data toggles at both rising and falling clock edges of signal Clk.

As integrated circuit technology scales towards smaller device dimensions, device performance continues to improve at the expense of increased power consumption. In an effort to reduce power consumption, more than one die may be placed within a single integrated circuit package (i.e., a multichip package). As different types of devices cater to different types of applications, more dies may be required in some systems to meet the requirements of high performance applications. Accordingly, to obtain better performance and higher density, an integrated circuit package may include multiple dies arranged laterally along the same plane and/or include one or more dies stacked on top of one another.

Figure 2:
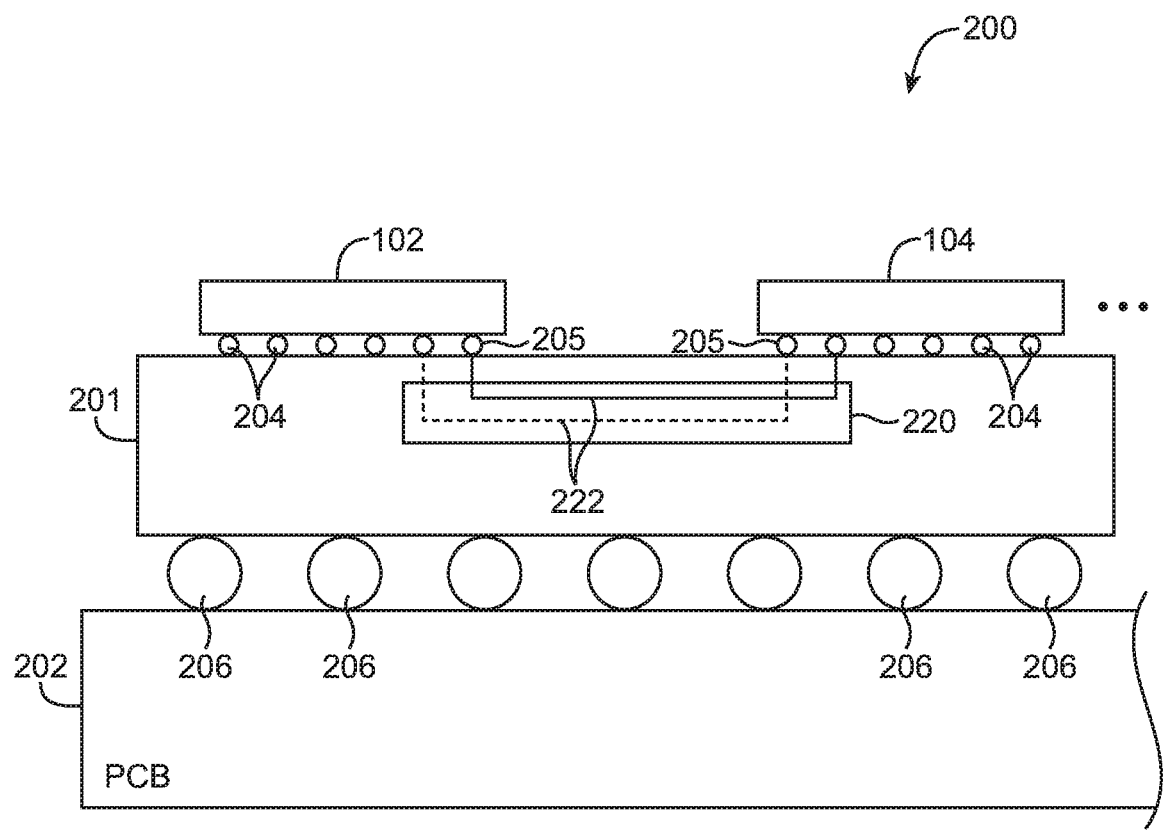
FIG. 2 is a cross-sectional side view of an illustrative multichip package that includes at least two integrated circuit dies operable to communicate with one another in accordance with an embodiment.

FIG. 2 is a cross-sectional side view of an illustrative multichip package 200 that includes a package substrate 201 and multiple integrated circuit (IC) dies such as IC dies 102 and 104 mounted on top of interposer 201. In order to facilitate communications between two chips on multichip package 200, package substrate 201 may be provided with an embedded multi-die interconnect bridge (EMIB) 220 that is designed and patented by INTEL Corporation (as an example). An EMIB is a small silicon die that may be embedded within substrate 201 and that offers dedicated ultra-high-density interconnection 222 between dies 102 and 104 within package 200. EMIB s generally include wires 222 of minimal length, which help to significantly reduce loading and directly boost performance. The use of EMIB 220 through which dies 102 and 104 may communicate with one another is merely illustrative. If desired, dies 102 and 104 may be configured to communicating with each other via an interposer die (e.g., an active interposer or a passive interposer) or other suitable types of inter-die interconnect structures.

Still referring to FIG. 2, package substrate 201 may be mounted on a printed circuit board (PCB) 202 using solder (e.g., solder balls or solder bumps) 206. The terms solder "balls" or solder "bumps" may sometimes be used interchangeably. Dies 102 and 104 may be mounted onto package substrate 201 using solder bumps (e.g., controlled collapse chip connection (C4) bumps) 204 and smaller microbumps 205. The pitch width of solder bumps 204 may be greater than the pitch width of microbumps 205 such that microbumps 205 have greater connection density than C4 bumps 204. The diameter of microbumps 205 are also generally smaller than the diameter of C4 bumps 204 (e.g., bumps 205 may be at least two times smaller, at least four times smaller, etc.)

Figure 3A:
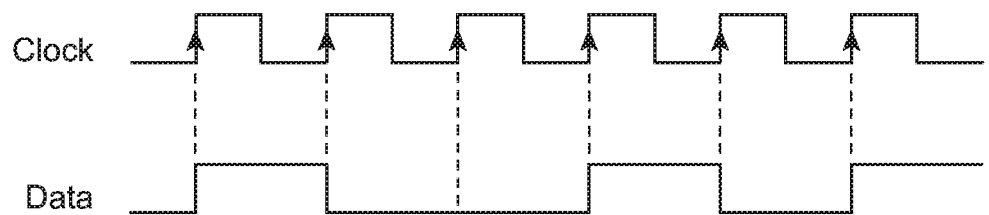
FIG. 3A is a diagram of a single data rate communications scheme.

FIG. 3A is a diagram of a single data rate (SDR) communications scheme. In SDR communications schemes, data bits are transferred only at the rising clock edges (or the falling clock edges but not both). In the example FIG. 3A, a data bit stream of "100101" is transmitted at the rising clock edges.

Figure 3B:
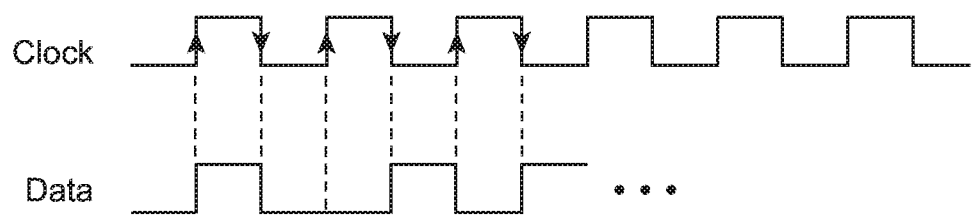
FIG. 3B is a diagram of a double data rate communications scheme in accordance with an embodiment.

FIG. 3B is a diagram of a double data rate (DDR) communications scheme in accordance with an embodiment. In DDR communications schemes, data bits are transferred at both rising clock edges and falling clock edges. In the example of FIG. 3B, the same data bit stream of "100101" can be transmitted in half the amount of time compared to the SDR operation shown in FIG. 3A. Data transmitted at the rising clock edges are sometimes referred to as "even" data bits, whereas data transmitted at the falling clock edges are sometimes referred to as "odd" data bits. Device configurations in which data is transmitted between dies 102 and 104 within the same multichip package using DDR may sometimes be described as an example herein. This is, however, merely illustrative. If desired, the disclosed circuitry, methods, and techniques for reducing the total number of required input-output bumps may be extended to DDR communications between any two electronic device components.

Figure 4:
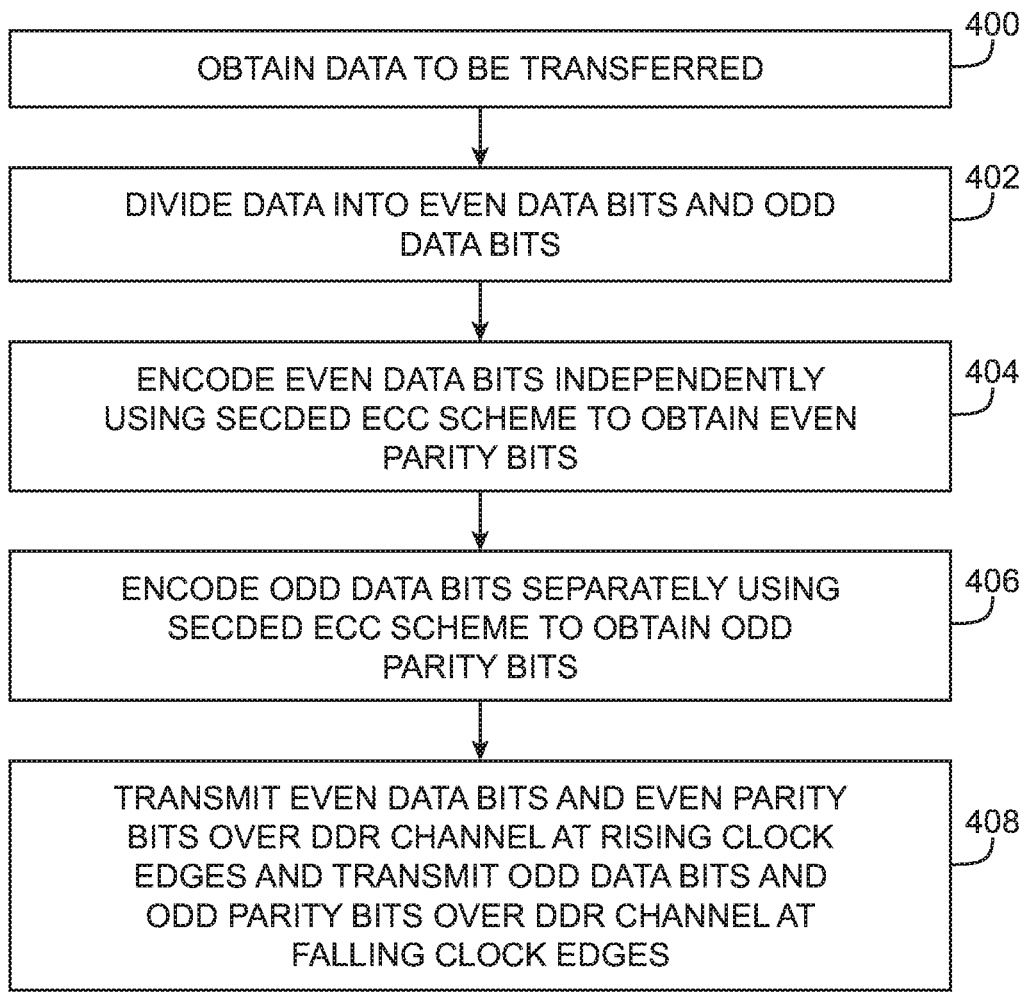
FIG. 4 is a flow chart of steps for dividing data into even and odd bits prior to encoding the data.

As described above in the Background section, inter-die transfer that does not support initial redundancy configuration often relies on error correcting code (ECC) to provide redundancy directly into the bits transmitted. FIG. 4 is a flow chart of steps illustrating one possible ECC encoding method. At step 400, the ECC encoder may receive or otherwise obtain the data to be transmitted.

At step 402, data may first be divided into even data bits and odd data bits. At step 404, the ECC encoder may encode the even bits independently using (for example) the single error correction and double error detection (SEC-DED) ECC scheme to generate corresponding even parity bits. Similarly, at step 406, the ECC encoder may separately encode the odd data bits.

At step 408, the encoder may output the even data bits and the even parity bits generated at step 404 at the rising edges of the TX clock while outputting the odd data bits and the odd parity bits generated at step 406 at the falling edges of the TX clock. In summary, this method involves encoding the even and odd data bits independently using the SEC-DED ECC scheme.

Figure 5:
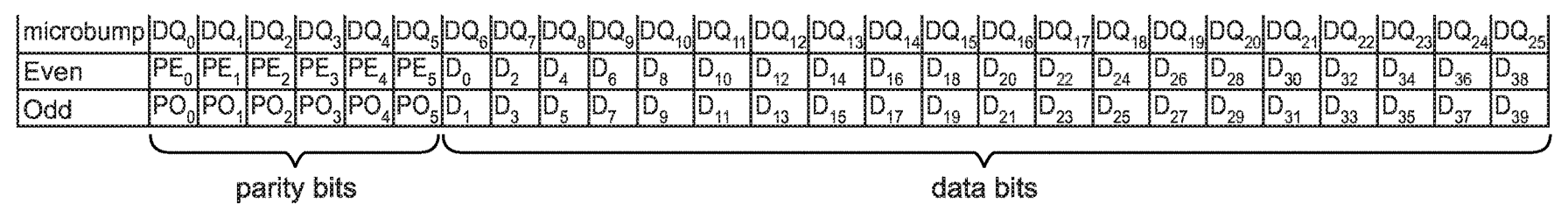

FIG. 5 is a table 600 showing how 26 microbumps are needed to perform DDR transfer of 40 data bits and 12 parity bits using the ECC encoding scheme described in connection with FIG. 4. As shown in FIG. 5, six microbumps DQ0-DQ5 are used to transmit six even parity bits PE0-PE5 at rising clock edges and to transmit six odd parity bits PO0-PO5 at falling clock edges. The remaining 20 microbumps DQ6-DQ25 are used transmit 20 even data bits {D0, D2, D4, ..., D36, D38} at the rising clock edges and to transmit 20 odd data bits {D1, D3, D5, ..., D37, D39} at the falling clock edges. The number of microbumps (r) that are required to transmit all the even and odd parity bits generated using this method may be expressed by the following expression:

$$r > 1 + \log_2(k+r) \quad (1)$$

where r represents the parity microbumps count (i.e., the number of microbumps needed to transmit the even and odd parity bits using DDR) and where k represents the data microbump count (i.e., the number of microbumps needed to transmit the even and odd data bits using DDR).

FIG. 6 is a table illustrating the total number of microbumps (n) needed as a function of the number of data bits using the ECC encoding scheme of FIG. 4 that first divides the whole data stream into separate even and odd data bits and then encodes them separately. Column 602 lists the total number of data bits (d). Column 606 lists k, the data microbump count. Assuming DDR is used, k is simply equal to d/2. Column 610 lists the values computed using expression 1 above. Column 608 lists parity microbump count r, which is the next lowest integer greater than the corresponding value in column 610. Column 604 lists the total microbump count n, which is simply equal to (k+r).

Row 690 in table 600 summarizes the microbump configuration shown in FIG. 5, where d=40 and n turns out to be equal to 26 and where r=6. In other words, integer r represents the microbump overhead that is needed for the SEC-DED encoding. In this example where d=40, almost a quarter of the total microbumps are wasted on ECC parity bits instead of data transfer. It would therefore be desirable to provide an improved ECC scheme that requires fewer total parity microbumps in order to transmit more data bits.

In accordance with an embodiment, an ECC encoding scheme is provided that requires fewer parity bits and thus helps to reduce the total microbump overhead. This reduction in parity bits may be achieved by recognizing and exploiting a DDR error characteristic associated with a single defective microbump. The DDR error characteristic at a single microbump is as follows: if a single microbump is defected, it will either be stuck at "0", stuck at "1", or floating, which can either be floated at zero or one. In any case, that microbump will be stuck at a fixed value and will effect both even and odd bits.

Figures 7A, 7B, 7C, 7D:
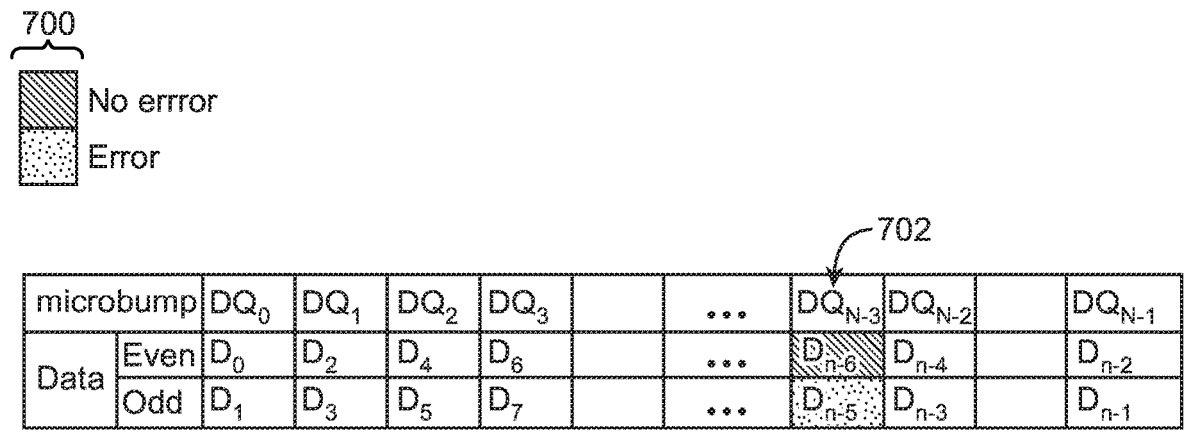
FIG. 7A is a table illustrating how a microbump defect can result in a single odd data bit error in accordance with an embodiment.
FIG. 7B is a table illustrating how a microbump defect can result in a single even data bit error in accordance with an embodiment.
FIG. 7C is a table illustrating how a microbump defect can result in erroneous odd and even data bits in accordance with an embodiment.
FIG. 7D is a table illustrating how a microbump defect can result in no error bits in accordance with an embodiment.

FIG. 7A is a table illustrating how a microbump defect can result in a single odd data bit error. Legend 700 illustrates which bit is erroneous. In the examples of FIG. 7A-7D, assume that microbump $DQ_{N-3}$ is defective or faulty. Assuming that microbump is stuck at zero, a single odd data bit error can occur if the desired data bits to be transmitted in that clock cycle are "01". If the microbump is stuck or floating at one, a single odd data bit error might occur if the desired data bits to be transmitted in that cycle are "10".

FIG. 7B is a table illustrating how a microbump defect at $DQ_{N-3}$ can result in a single even data bit error. Assuming that microbump is stuck or floating at "0", a single even data bit error can occur if the desired data bits to be transmitted in that clock cycle are "10". If the microbump is stuck or floating at "1", a single even data bit error would occur if the desired data bits to be transmitted in that cycle are "01".

FIG. 7C is a table illustrating how a microbump defect at $DQ_{N-3}$ can result in errors at both even and odd bits. Assuming that microbump is stuck or floating at "0", double adjacent error can occur if the desired data bits to be transmitted in that clock cycle are "11". If the microbump is stuck or floating at "1", dual bit error would occur if the desired data bits to be transmitted in that cycle are "00".

FIG. 7D is a table illustrating how a microbump defect at $DQ_{N-3}$ can result in no errors for both even and odd bits. Assuming that microbump is stuck or floating at "0", a lack of error can occur if the desired data bits to be transmitted in that clock cycle are "00". If the microbump is stuck or floating at "1", it would also be error free if the desired data bits to be transmitted in that cycle are "11". In summary, a single microbump defect can result in the four possible data scenarios illustrated in FIGS. 7A-7D when transferred using DDR. If there are two errors (as shown in the case of FIG. 7C), then it would only occur at a single microbump.

Figure 8A:
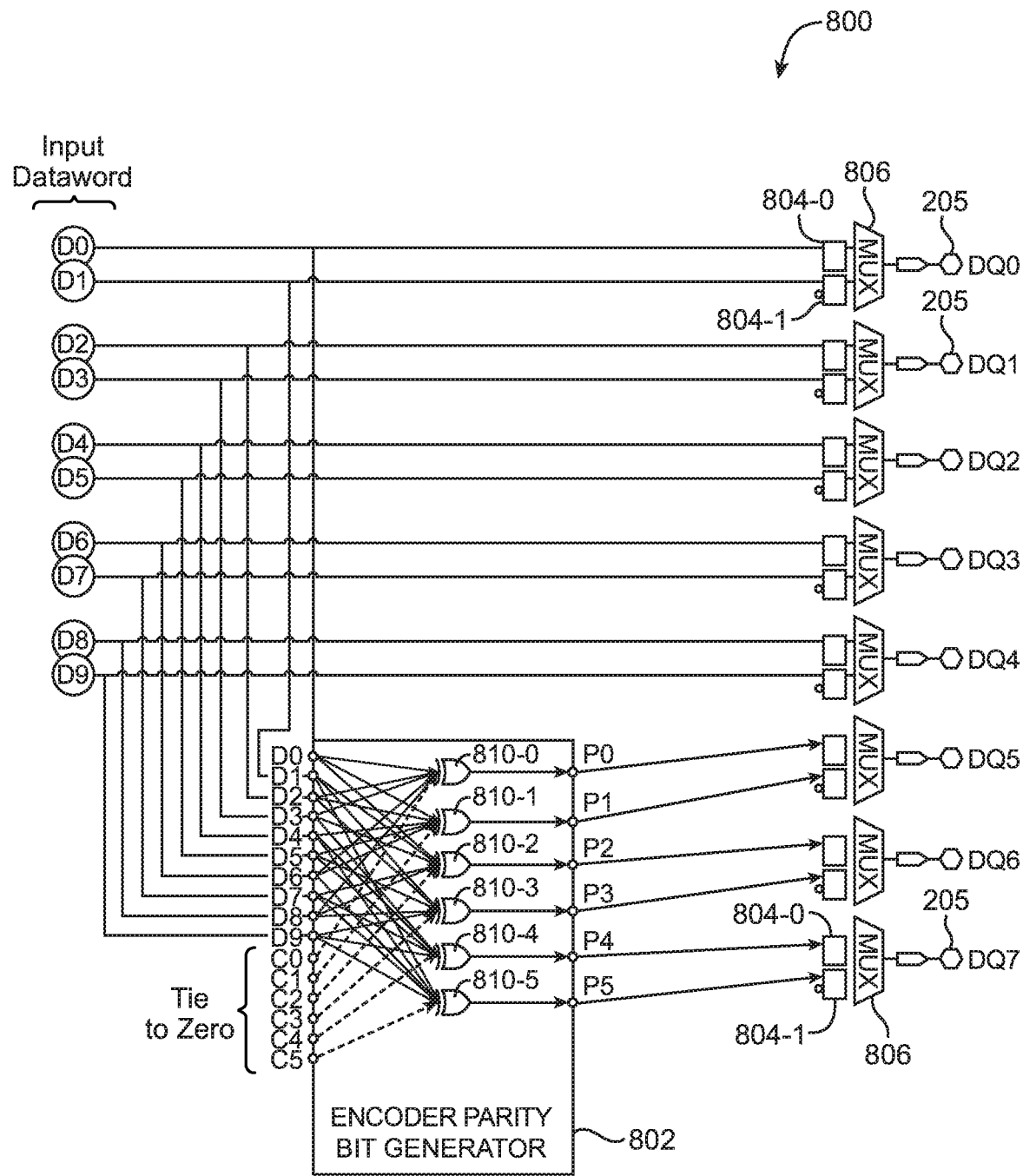
FIG. 8A is a diagram of an illustrative error correcting code (ECC) encoder circuit in accordance with an embodiment.

FIG. 8A is a diagram of an illustrative error correcting code (ECC) encoder circuit such as encoder 800. In the example of FIG. 8A, encoder 800 may be configured to encode and transmit an input data word having ten data bits D0-D9. The even data bits may be latched using registers 804-0 at rising clock edges, whereas the odd data bits may be latched using registers 804-1 as falling clock edges. Encoder 800 may further include multiplexers 806 corresponding to each pair of even and odd data bits for selectively outputting the even data bits during the high clock phase and outputting the odd data bits during the low clock phase. Multiplexers 806 may directly or indirectly drive corresponding microbumps 205. The 10 data bits may be transmitted to a destination die via microbumps DQ0-DQ4.

As shown in FIG. 8A, encoder 800 may further include an encoder parity bit generating circuit such as encoder parity bit generator 802. Parity bit generator 802 may receive at least the input data word and generate corresponding parity bits P0-P5 (sometimes referred to as "parity check" bits) in accordance with an improved encoding scheme such as the encoding methodology illustrated in FIG. 9. At step 900, ECC encoder 800 may receive or otherwise obtain the data to be transmitted.

At step 902, encoder 800 may, without dividing the data into even and odd bits, directly encode the data using a single error correcting, double error detecting, and double adjacent error correcting (SEC-DED-DAEC) ECC scheme. The SEC-DED-DAEC may impose all of the following constraints on a parity check matrix that is used to implement the ECC scheme:

NO ALL ZERO COLUMNS

EVERY COLUMN MUST BE DISTINCT

EVERY COLUMN CONTAINS AN ODD NUMBER OF "1s"

EVERY EVEN & ODD COLUMN PAIR MUST BE DISTINCT.

Constraints a-c are imposed by the SEC-DED algorithm, whereas constraint d is imposed by the DAEC portion. Constraints a-c provide a way to detect the single bit errors illustrated in FIGS. 7A and 7B. Constraint d, which requires that every even and odd column vector in the H-matrix to be unique, provides a way to detect double-bit errors at a single microbump as illustrated in the example of FIG. 7C. Due to the distinct nature of all four constraints, no error will be flagged when the data is error free as illustrated in the example of FIG. 7D.

FIG. 10A is a diagram of an illustrative parity check matrix 1000 for an ECC(n=16, d=10) encoding scheme satisfying the four constraints a-d. A parity check matrix (sometimes referred to as an "H-matrix") have rows representing the coefficients of the parity check equations/calculation, showing how linear combinations of certain digits of each code word equal zero, and have columns corresponding to the different microbumps. Thus, the number of rows in H-matrix 1000 should be equal to the parity microbump count.

As shown in FIG. 10A, the first ten columns correspond to the data microbumps, and the remaining six columns correspond to the parity microbumps. Note that none of the columns in matrix 1000 are all zeros (satisfying constraint a), that every column is different from every other column (satisfying constraint b), that every column has an odd number of ones (satisfying constraint c), and that every even/odd column pair is distinct (i.e., columns 0/1 are distinct from columns 2/3, which are also distinct from columns 4/5, etc., thereby also satisfying constraint d).

FIG. 10B lists the value of each column in matrix 1000 in decimal form for ease of discussion. For example, the binary value "000111" in the first column 1002 of matrix 1000 is converted from binary to its corresponding decimal value of 7 (see portion 1020 in FIG. 10B). The binary value "101100" in the second column 1004 of matrix 1000 is converted from binary to its corresponding decimal value of 44. The binary value "001011" in the third column 1006 of matrix 1000 is converted from binary to its corresponding decimal value of 11. The binary value "010101" in the fourth column 1008 of matrix 1000 is converted from binary to its corresponding decimal value of 21. Skipping ahead to the penultimate column 1010, the binary value "010000" is converted from binary to its corresponding decimal value of 16. Finally, the binary value "100000" in the last column 1012 of matrix 1000 is converted from binary to its corresponding decimal value of 32. Each of these values in row 1020 correspond to the pattern for single bit errors such as those illustrated in connection with FIGS. 7A and 7B.

Figure 9:
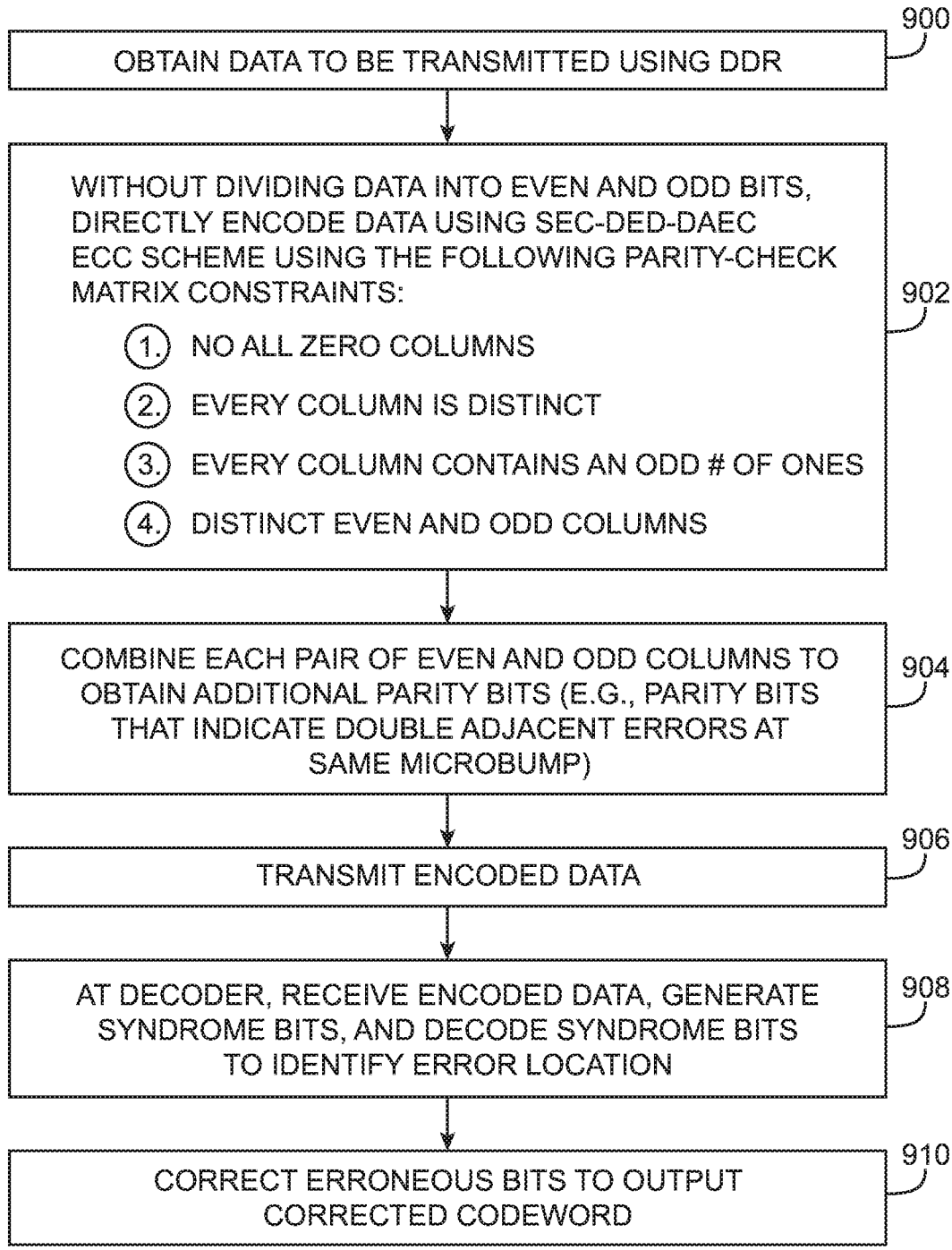
FIG. 9 is a flow chart of illustrative steps for encoding data bits using a single error correcting, double error detecting, and double adjacent error correcting (SEC-DED-DAEC) ECC scheme suitable for double data rate (DDR) transfer and decoding the corresponding encoded data bits in accordance with an embodiment.

Referring briefly back to FIG. 9, at step 904, the encoding scheme may then combine each pair of even and odd columns to obtain additional parity bits (e.g., parity bits that indicate double adjacent even/odd errors at the same microbump). One way of generating the additional parity bits is to compute the exclusive-OR (XOR) of each even and odd column pair. As shown in FIG. 10B, the values of the first even/odd column pair may be XORed together to yield a first additional parity bit with the decimal value 43 (see row portion 1030). The values of the second even/odd column pair are XORed together to yield a second additional parity bit with the decimal value 30. The values of the third even/odd column pair are XORed together to yield a third additional parity bit with the decimal value 40. Skipping ahead to the final column pair, the even/odd column values are XORed together to yield an eighth additional parity bit with the decimal value 48. Note that each value in row 1030 is distinct (e.g., the XOR value of each even and odd column pair is distinct from every other XORed value). The example of FIG. 10B in which an XOR function is used to compute the unique additional parity bits is merely illustrative. If desired, some other logical, arithmetic, or mapping function(s) can be used to combine the even/odd column pairs to generate corresponding unique parity bits.

Referring now back to FIG. 8A, note that the encoder parity bit generator 802 may be implemented in accordance with the bit pattern specified in H-matrix 1000. In the example of FIG. 8A, parity bit generator 802 may include a logic XOR gate 810-0 configured to output a first parity bit P0, a logic XOR gate 810-1 configured to output a second parity bit P1, a logic XOR gate 810-2 configured to output a third parity bit P2, a logic XOR gate 810-3 configured to output a fourth parity bit P3, a logic XOR gate 810-4 configured to output a fifth parity bit P4, and logic XOR gate 810-5 configured to output a sixth parity bit P5. The six parity bits P0-P5 may be transmitted to the target IC die using DDR via corresponding microbumps DQ5, DQ6, and DQ7.

Each of these encoder logic gates 810 may receive a respective group inputs based on position of high bits in H-matrix 1000 of FIG. 10A. For example, logic gate 810-0 may generate parity bit P0 by receiving and XORing D0, D2, D3, D6, D8, and C0 (see, e.g., the position of "1" bits in the first row of H-matrix 100). Note that inputs C0-C5 of generator 802 may optionally be tied to zero. The connection of C0-C5 to the respective gates 810 are also optional since error in parity does not affect the data bits. As another example, logic gate 810-1 may generate parity bit P1 by receiving and XORing D0, D2, D4, D5, D6, and C1 (see, e.g., the position of "1" bits in the second row of H-matrix 100). As yet another example, logic gate 810-5 may generate parity bit P5 by receiving and XORing D1, D4, D6, D7, D9, and C5 (see, e.g., the position of "1" bits in the bottom row of H-matrix 100).

The particular encoder configuration of FIG. 8A is merely illustrative. In general, the implementation of encoder parity bit generator 802 may vary depending on the size and the specific pattern of values in the associated H-matrix. If desired, parity bit generator 802 may include any suitable number of logic gates and can include any combination of different types of logic gates (e.g., logic XOR gates, XNOR gates, AND gates, NAND gates, OR gates, NOR gates, etc.), each of which may include any desired number of inputs.

Referring back to FIG. 9, the encoder may then transmit the encoded data along with the parity bits generated by parity bit generator 802 using DDR (step 906). At step 908, a corresponding decoder in the receiver IC die may receive the encoded data via the microbumps, may generate syndrome bits, and decode the syndrome bits to identify the error location. At step 910, the decoder may then correct any erroneous bits to output a corrected codeword.

Figure 8B:
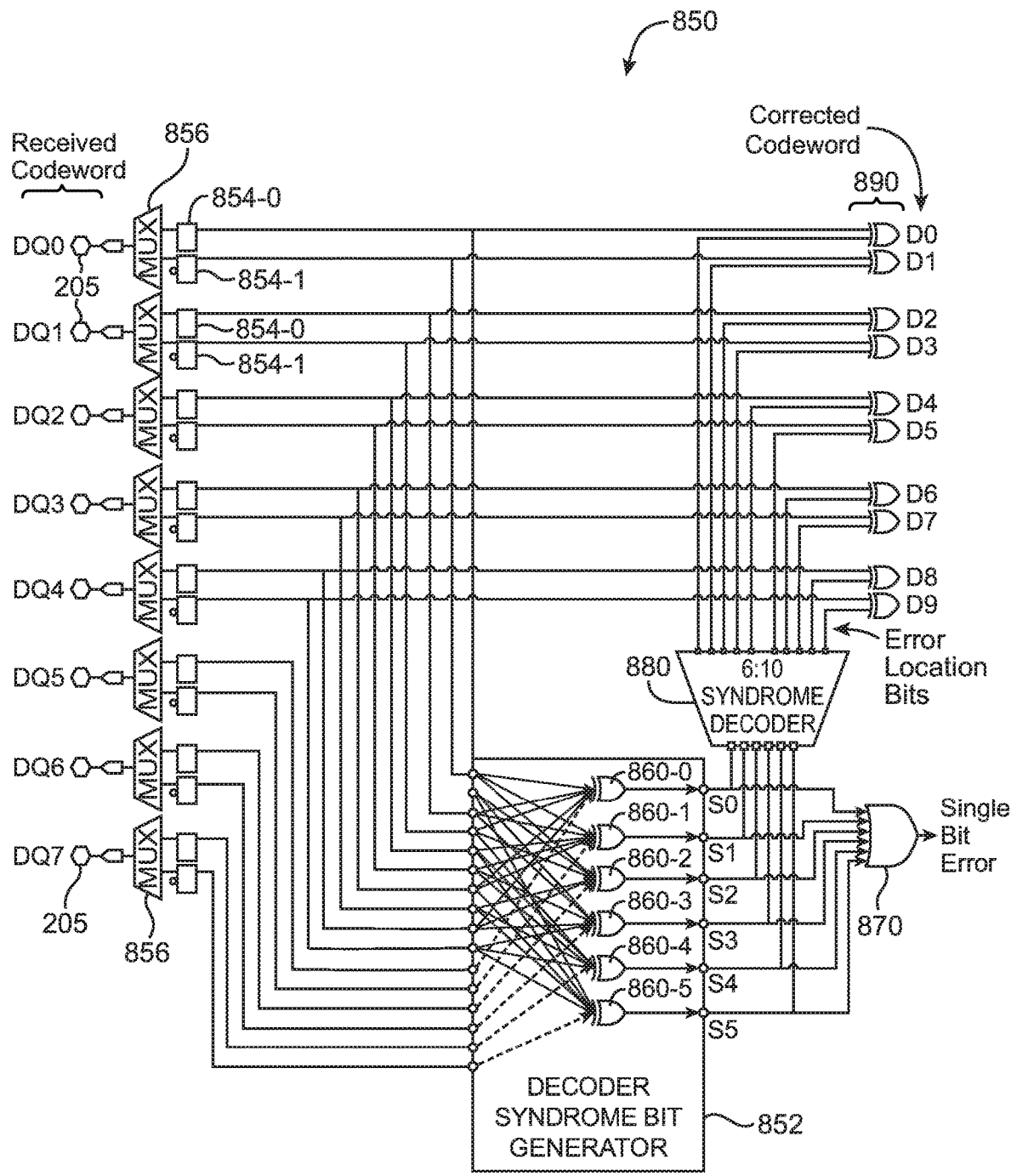
FIG. 8B is a diagram of an illustrative error correcting code (ECC) decoder circuit in accordance with an embodiment.

FIG. 8B is a diagram of an illustrative error correcting code (ECC) decoder circuit such as ECC decoder 850. Decoder 850 may be configured to decode the encoded codeword that is received from encoder 800 of FIG. 8A via a DDR transfer scheme. As shown in FIG. 8A, decoder 850 may include demultiplexers 856 for separating the even and odd data bits received from microbumps DQ0-DQ7. The even data bits may be latched using registers 854-0 at rising clock edges, whereas the odd data bits may be latched using registers 854-1 as falling clock edges. Decoder 850 may further include a decoder syndrome bit generating circuit such as decoder syndrome bit generator 852. Syndrome bit generator 852 may have a first set of inputs configured to receive the even and odd data bits received over microbumps DQ0-DQ4 and a second set of inputs configured to receive the even and odd parity bits received over microbumps DQ5-DQ7.

Syndrome bit generator 852 may generate corresponding syndrome bits S0-S5 in accordance with the improved SEC-DED-DAEC ECC scheme operating in accordance with the four H-matrix constraints described above in connection with FIG. 9. In other words, the decoder syndrome bit generator 852 may also be implemented in accordance with the bit pattern specified in H-matrix 1000 of the type shown in FIG. 10A. In the example of FIG. 10A, syndrome bit generator 852 may include a logic XOR gate 860-0 configured to output a first syndrome bit S0, a logic XOR gate 860-1 configured to output a second syndrome bit S1, a logic XOR gate 860-2 configured to output a third syndrome bit S2, a logic XOR gate 860-3 configured to output a fourth syndrome bit S3, a logic XOR gate 860-4 configured to output a fifth syndrome bit S4, and logic XOR gate 860-5 configured to output a sixth syndrome bit S5.

Since the same H-matrix governs both the encoding and decoding aspect of the ECC transfer, the inputs of logic gates 860 may be connected in the same way as encoder parity bit generator 802 shown in FIG. 8A (e.g., the decoder syndrome bit generator and the encoder parity bit generator may have the same or substantially similar structure and wiring scheme). The particular decoder configuration of FIG. 8B is, however, merely illustrative. In general, the implementation of decoder syndrome bit generator 852 may vary depending on the size and the specific pattern of values in the associated H-matrix. If desired, syndrome bit generator 852 may include any suitable number of logic gates and can include any combination of different types of logic gates (e.g., logic XOR gates, XNOR gates, AND gates, NAND gates, OR gates, NOR gates, etc.), each of which may include any desired number of inputs.

The decoder syndrome bit generator 852 is configured such all of the syndrome bits S0-S5 will be equal to zero when the data is error free. In other words, at least one of the syndrome bits will be equal to "1" when the data is erroneous. Thus, decoder 850 may include a logic gate such as logic OR gate 870 that receives all of the syndrome bits and that outputs an asserted signal when a single bit error is detected.

The syndrome bits output by syndrome bit generator 852 can be used to help identify the type and location of error bits. Assuming that the parity bits in the H-matrix 1000 described in connection with FIGS. 10A and 10B are used, a syndrome decimal value of 43 means that there is a single bit error at data bit D0; a syndrome value of 44 means that there is a single bit error at data bit D1; a syndrome value of 43 means that both data bits D0 and D1 transmitted over microbump DQ0 are erroneous; a syndrome value of 11 means that there is a single bit error at data bit D2; a syndrome value of 21 means that there is a single bit error at data bit D3; a syndrome value of 30 means that both data bits D2 and D3 transmitted over microbump DQ1 are erroneous; and so on.

Decoder 850 may further include a syndrome decoder 880 that receives the syndrome bits from generator 852 and that outputs high bit(s) at the corresponding error locations. In the example of FIG. 8B where there are six syndrome bits and ten data bits, syndrome decoder 880 may be implemented as a 6:10 demultiplexing circuit. Syndrome decoder 880 may therefore sometimes be referred to as a syndrome demultiplexer. This particular configuration is merely illustrative. In general, the number of inputs of syndrome decoder 880 may be at least equal to the number of total syndrome bits generated at the decoder, and the number of outputs of syndrome demultiplexer 880 may be at least equal to the total number of data bits. For instance, if the syndrome bits yield a decimal value of 43, then syndrome demultiplexer 880 may selectively drive an output bit high corresponding to data bit D0 while leaving all the other outputs low. As another example, if the syndrome bits yield a decimal value of 43, then syndrome demultiplexer 880 may selectively drive the output bits corresponding to data bits D0 and D1 high while leaving the remaining bits low. As yet another example, if the syndrome bits yield a decimal value of 56, then syndrome demultiplexer 880 may selectively drive the output bit corresponding to data bit D9 high while leaving the remaining bits low.

Decoder 890 may further include an error correction circuit 890 configured to receive the transmitted data bits, to receive the error location bits output from syndrome demultiplexer 880, and to output a corresponding corrected codeword. In the example of FIG. 8B, error corrector 890 may be implemented using a group of XOR gates, each of which has a first input that receives one of the even/odd data bits and a second input that receives the selectively asserted error location bit from syndrome decoder 880. If the error location bit is low (deasserted), the data bit received at the first XOR input will be passed through without change. If the error location bit is high (asserted), then the data bit received at the first XOR input will be inverted from the presumably incorrect value to the correct value. If desired, other ways of implementing the error correction may be used.

In the example of FIGS. 8-10 in which 10 data bits D0-D9 are being transferred, five data microbumps and three parity microbumps are used to support this encoding/transmission scheme. In accordance with an embodiment, the number of microbumps (s) that are required to transmit all the even and odd parity bits generated using a method of the type described in connection with at least FIG. 9 may be expressed by the following expression:

$$s > (1 + \log_2(2k+2s))/2 \qquad (2)$$

where s represents the parity microbumps count (i.e., the number of microbumps needed to transmit the even and odd parity bits using DDR) and where k represents the data microbump count (i.e., the number of microbumps needed to transmit the even and odd data bits using DDR).

FIG. 11 is a table 1100 illustrating the total number of microbumps (n) needed as a function of the number of data bits using the ECC encoding scheme of FIG. 9 that encodes whole DDR data stream without first separating data bits into even and odd portions. Column 1102 lists the total number of data bits (d). Column 1106 lists k, the data microbump count. Assuming DDR is used, k is simply equal to d/2. Column 1110 lists the values computed using expression 2 above. Column 1108 lists parity microbump count s, which is the next lowest integer greater than the corresponding value in column 1110. Column 1104 lists the total microbump count n, which is simply equal to (k+s).

Row 1190 in table 1100 summarizes the microbump configuration shown in FIG. 5, where d=40 and n turns out to be equal to 24 and where s=4. In other words, integer s represents the microbump overhead that is needed for the SEC-DED-DAEC encoding. Compared to the previous SEC-DED encoding scheme that requires 26 total microbumps, this improved DDR-specific SEC-DED-DAEC encoding scheme requires only 24 total microbumps, which requires 33% fewer parity microbumps. This overhead savings or reduction in parity bits/microbump count is magnified as the number of data bits increase.

Figure 12:
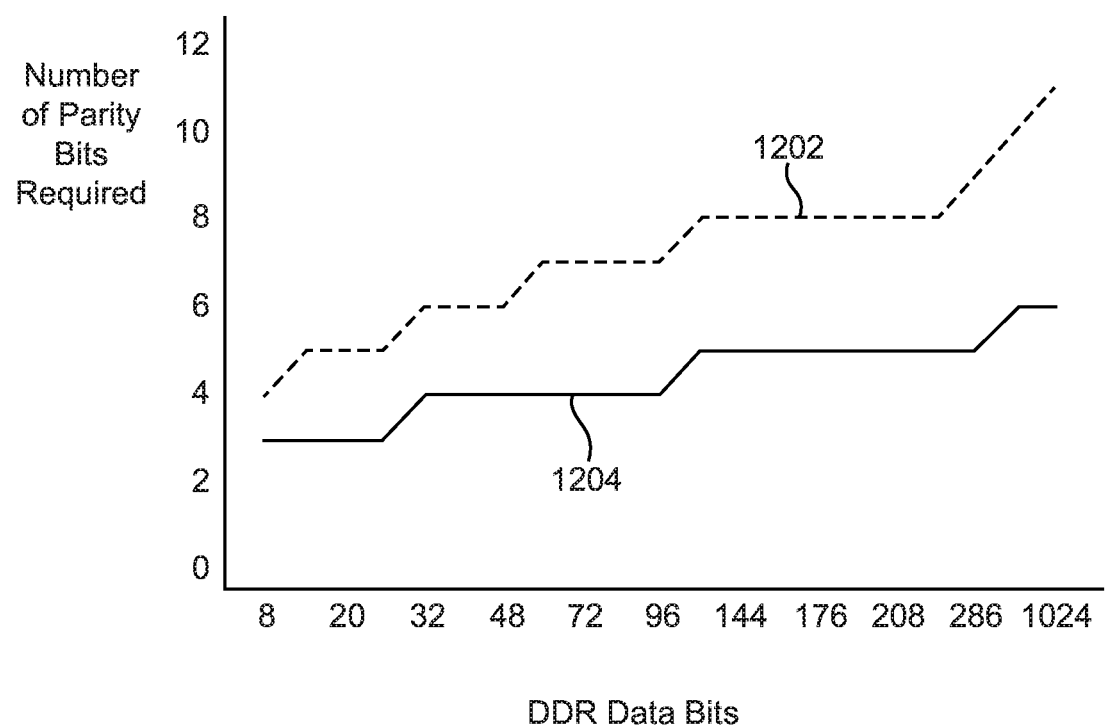
FIG. 12 is a plot illustrating how the ECC scheme of FIG. 9 requires much fewer parity bits relative to the ECC scheme of FIG. 4 in accordance with an embodiment.

FIG. 12 is a plot illustrating how the ECC scheme of FIG. 9 requires much fewer parity bits relative to the ECC scheme of FIG. 4. Curve 1202 represents the requisite number of parity bits as a function of DDR data bits when using the encoding scheme of FIG. 4, whereas 1204 represents the requisite number of parity bits as a function of DDAR data bits when using the encoding/decoding scheme described in connection with FIGS. 7-11. As shown in FIG. 12, the improved encoding scheme uses substantially fewer parity bits (thus requiring much fewer parity microbumps), and the gap widens as the number of data bits increases beyond 100 or more.

EXAMPLE EMBODIMENTS

The following examples pertain to further embodiments.

Example 1 is an integrated circuit, comprising: a first group of bumps configured to receive data bits from another integrated circuit; a second group of bumps configured to receive parity bits from the another integrated circuit, wherein the data bits and the parity bits are transmitted to the another integrated circuit using a double data rate (DDR) transfer scheme; and a syndrome bit generating circuit that is configured to receive the data bits from the first group of bumps and that is configured to implement a decoding scheme that exploits an error characteristic associated with the DDR transfer scheme at a defective bump in the first group of bumps to reduce the total number of required bumps in the second group of bumps.

Example 2 is the integrated circuit of example 1, wherein the defective bump is optionally configured to receive an even data bit at a rising clock edge and an odd data bit at a falling clock edge.

Example 3 is the integrated circuit of example 2, wherein the error characteristic associated with the DDR transfer scheme at the defective bump optionally comprises up to four possible error scenarios.

Example 4 is the integrated circuit of example 3, wherein the four possible error scenarios optionally comprise a single error at the even data bit and a single error at the odd data bit.

Example 5 is the integrated circuit of example 4, wherein the four possible error scenarios optionally further comprises errors at both the even data bit and the odd data bit and no errors at the even data bit and the odd data bit.

Example 6 is the integrated circuit of any one of examples 1-5, wherein the decoding scheme of the syndrome bit generating circuit is optionally implemented based on a single error correcting, double error detecting, and double adjacent error correcting (SEC-DED-DAEC) error correcting code (ECC) scheme.

Example 7 is the integrated circuit of example 6, wherein the SEC-DED-DAEC ECC scheme optionally imposes at least four constraints on a parity check matrix that determines the configuration of the syndrome bit generating circuit.

Example 8 is the integrated circuit of example 7, wherein the at least four constraints optionally stipulates that: a) no columns in the parity check matrix are all zeros; b) every column in the parity check matrix is distinct; and c) every column in the parity check matrix contains an odd number of ones.

Example 9 is the integrated circuit of example 8, wherein the at least four constraints further optionally stipulates that: d) every even and odd column pair in the parity check matrix is distinct.

Example 10 is the integrated circuit of example 9, wherein the syndrome bit generating circuit is optionally implemented based on values in the parity check matrix and also based on additional parity bits obtained by combining even and odd columns in the parity check matrix.

Example 11 is the integrated circuit of example 10, wherein the additional parity bits optionally allow the syndrome bit generating circuit to identify adjacent even and odd bit errors at the defective bump.

Example 12 is an integrated circuit, comprising: a first group of bumps configured to output data bits to another integrated circuit; a second group of bumps configured to output parity bits to the another integrated circuit; and a parity bit generating circuit that is configured to receive the data bits and that is configured to implement an encoding scheme that reduces the total number of required bumps in the second group of bumps by taking advantage of a double data rate (DDR) error characteristic of a defective bump in the first group of bumps.

Example 13 is the integrated circuit of example 12, wherein the defective bump is optionally configured to receive an even data bit at a rising clock edge and an odd data bit at a falling clock edge.

Example 14 is the integrated circuit of example 13, wherein the DDR error characteristic associated with the DDR transfer scheme at the defective bump optionally comprises four possible error scenarios.

Example 15 is the integrated circuit of example 14, wherein the four possible error scenarios optionally comprise: a single error at the even data bit; a single error at the odd data bit; a double error at both the even data bit and the odd data bit; and no errors at the even data bit and the odd data bit.

Example 16 is the integrated circuit of any one of examples 12-15, wherein the encoding scheme of the parity bit generating circuit is optionally implemented based on a single error correcting, double error detecting, and double adjacent error correcting (SEC-DED-DAEC) error correcting code (ECC) scheme.

Example 17 is a system, comprising: a first integrated circuit die; and a second integrated circuit die configured to communicate with the first integrated circuit die via a plurality of microbumps, wherein: the first integrated circuit die is configured to transmit data bits to the second integrated circuit die using a double data rate (DDR) toggling scheme; and the first integrated circuit die comprises an encoder circuit configured to encode the data bits using an error correcting code (ECC) scheme that is capable of detecting and correcting adjacent even and odd data bit errors at a defective microbump in the plurality of microbumps.

Example 18 is the system of example 17, wherein the ECC scheme optionally comprises a single error correcting, double error detecting, and double adjacent error correcting (SEC-DED-DAEC) scheme that requires fewer parity bits than a single error correcting and double error detecting (SEC-DED) scheme.

Example 19 is the system of example 18, wherein the SEC-DED-DAEC scheme optionally imposes at least the following constraints on an H-matrix that determines the configuration of the encoder circuit: a) no columns in the H-matrix are all zeros; b) every column in the H-matrix is distinct; c) every column in the H-matrix contains an odd number of ones; and d) a function of an even column and an odd column in each associated column pair is distinct from the function of an even column and an odd column of every other column pair in the H-matrix.

Example 20 is the system of example 19, wherein the second integrated circuit die optionally comprises a decoder circuit configured to decode the data bits received from the first integrated circuit, and wherein the decoder circuit is implemented based on the H-matrix and also based on additional parity bits generated by taking the function of the even column and the odd column in each column pair of the H-matrix.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit device, comprising:
a plurality of microbumps to receive data bits and parity bits from another integrated circuit device using a double data rate (DDR) transfer scheme; and
decoding circuitry to receive the data bits from the plurality of microbumps and to implement a decoding scheme that exploits an error characteristic associated with the DDR transfer scheme at a defective microbump of the plurality of microbumps, wherein the error characteristic comprises a pattern corresponding to a single defective microbump repeating a value between consecutive bits in the DDR transfer scheme.

2. The integrated circuit device of claim 1, wherein the plurality of microbumps comprises a plurality of communication channels, and the plurality of communication channels comprise respective single defective microbumps.

3. The integrated circuit device of claim 1, wherein the decoding scheme is implemented based on a single error correcting, double error detecting, and double adjacent error correcting (SEC-DED-DAEC) error correcting code (ECC) scheme.

4. The integrated circuit device of claim 3, wherein the SEC-DED-DAEC ECC scheme imposes at least four constraints on a parity check matrix that determines a configuration of the decoding circuitry.

5. The integrated circuit device of claim 4, wherein the at least four constraints stipulates that:
a) no columns in the parity check matrix are all zeros;
b) every column in the parity check matrix is distinct; and
c) every column in the parity check matrix contains an odd number of ones.

6. The integrated circuit device of claim 5, wherein the at least four constraints further stipulates that:
d) every even and odd column pair in the parity check matrix is distinct.

7. The integrated circuit device of claim 6, wherein the decoding circuitry is implemented based on values in the parity check matrix and also based on additional parity bits obtained by combining even and odd columns in the parity check matrix.

8. The integrated circuit device of claim 7, wherein the additional parity bits enable the decoding circuitry to identify adjacent even and odd bit errors at the defective microbump.

9. An integrated circuit device, comprising:
a first group of microbumps configured to output data bits to another integrated circuit device using a double-data rate (DDR) transfer scheme;
a second group of microbumps configured to output parity bits to the other integrated circuit device; and
decoding circuitry that is configured to receive the data bits and that is configured to implement a decoding scheme that exploits an error characteristic associated with the DDR transfer scheme at a defective microbump of the first group of microbumps, wherein the error characteristic comprises a pattern corresponding to a single defective microbump repeating a value between consecutive bits in the DDR transfer scheme.

10. The integrated circuit device of claim 9, wherein the defective microbump is configured to receive an even data bit at a rising clock edge and an odd data bit at a falling clock edge.

11. The integrated circuit device of claim 9, wherein the decoding scheme is implemented based on a single error correcting, double error detecting, and double adjacent error correcting (SEC-DED-DAEC) error correcting code (ECC) scheme.

12. The integrated circuit device of claim 11, wherein the SEC-DED-DAEC ECC scheme imposes at least four constraints on a parity check matrix that determines the configuration of the decoding circuitry.

13. The integrated circuit device of claim 12, wherein the at least four constraints stipulates that:
a) no columns in the parity check matrix are all zeros;
b) every column in the parity check matrix is distinct;
c) every column in the parity check matrix contains an odd number of ones; and
d) every even and odd column pair in the parity check matrix is distinct.

14. The integrated circuit device of claim 13, wherein the decoding circuitry is implemented based on values in the parity check matrix and also based on additional parity bits obtained by combining even and odd columns in the parity check matrix.

15. The integrated circuit device of claim 14, wherein the additional parity bits enable the decoding circuitry to identify adjacent even and odd bit errors at the defective microbump using the repeated value.

16. A system, comprising:
a first integrated circuit die; and
a second integrated circuit die configured to communicate with the first integrated circuit die via a plurality of microbumps, wherein:
the first integrated circuit die is configured to transmit data bits to the second integrated circuit die via the plurality of microbumps using a double data rate (DDR) toggling scheme; and
the first integrated circuit die comprises an encoder circuitry configured to encode the data bits using an error correcting code (ECC) scheme that is to detect even and odd data bit errors at a defective microbump in the plurality of microbumps using an identified error characteristic, wherein the error characteristic comprises a pattern corresponding to a single defective microbump repeating a value between consecutive bits in the DDR toggling scheme.

17. The system of claim 16, wherein the ECC scheme comprises a single error correcting, double error detecting, and double adjacent error correcting (SEC-DED-DAEC) scheme that requires fewer parity bits than a single error correcting and double error detecting (SEC-DED) scheme.

18. The system of claim 17, wherein the SEC-DED-DAEC scheme imposes at least the following constraints on an H-matrix that determines the configuration of the encoder circuitry:
   a) no columns in the H-matrix are all zeros;
   b) every column in the H-matrix is distinct;
   c) every column in the H-matrix contains an odd number of ones; and
   d) a function of an even column and an odd column in each associated column pair is distinct from the function of an even column and an odd column of every other column pair in the H-matrix.

19. The system of claim 18, wherein the second integrated circuit die comprises a decoder circuitry configured to decode the data bits received from the first integrated circuit die, and wherein the decoder circuitry is implemented based on the H-matrix and also based on additional parity bits generated by taking the function of the even column and the odd column in each column pair of the H-matrix.

20. The system of claim 19, wherein additional parity bits enable the decoding circuitry to identify adjacent even and odd bit errors at the defective microbump using the repeated value.

* * * * *